US009479156B2

(12) United States Patent
Kwon et al.

(10) Patent No.: US 9,479,156 B2
(45) Date of Patent: Oct. 25, 2016

(54) GATE DRIVER AND DISPLAY APPARATUS HAVING THE SAME

(71) Applicants:Samsung Display Co., Ltd., Yongin (KR); Industry-University Cooperation Foundation Hanyang University, Seoul (KR)

(72) Inventors: Oh-Kyong Kwon, Seoul (KR); Yeong-Keun Kwon, Yongin-si (KR); Jong-Hee Kim, Hwaseong-si (KR); Ji-Sun Kim, Seoul (KR); Jae-Keun Lim, Suwon-si (KR); Chong-Chul Chai, Seoul (KR)

(73) Assignees: Samsung Display Co., Ltd., Yongin-si (KR); Industry-University Cooperation Foundation Hanyang University, Seoul (KR)

( * ) Notice: Subject to any disclaimer, the term of this patent is extended or adjusted under 35 U.S.C. 154(b) by 101 days.

(21) Appl. No.: 14/312,139

(22) Filed: Jun. 23, 2014

(65) Prior Publication Data

US 2015/0042547 A1    Feb. 12, 2015

(30) Foreign Application Priority Data

Aug. 7, 2013    (KR) .................. 10-2013-0093736

(51) Int. Cl.
*G09G 3/36* (2006.01)
*H03K 17/30* (2006.01)
*G11C 19/28* (2006.01)

(52) U.S. Cl.
CPC .......... *H03K 17/302* (2013.01); *G09G 3/3677* (2013.01); *G11C 19/28* (2013.01); *G09G 2310/0286* (2013.01); *G09G 2320/0219* (2013.01); *G09G 2320/043* (2013.01)

(58) Field of Classification Search
CPC .............................................. G09G 2310/0286
USPC .......................................................... 345/204
See application file for complete search history.

(56) References Cited

U.S. PATENT DOCUMENTS

2010/0134471 A1    6/2010 Seo et al.
2010/0195366 A1    8/2010 Chen et al.
(Continued)

FOREIGN PATENT DOCUMENTS

KR    10-2014-0042308    4/2014

OTHER PUBLICATIONS

Lee, Won-Kyu, et al., "Amorphous Silicon Gate Driver with Low Power Consumption and Highly Driving Capability for High Resolution Mobile Displays," IDW, 2006, pp. 739-742, School of Electrical Engineering (#50), Seoul National University, Seoul, Korea.

(Continued)

*Primary Examiner* — Viet Pham
(74) *Attorney, Agent, or Firm* — H.C. Park & Associates, PLC

(57) ABSTRACT

A gate driver, including multiple stages of gate driving circuits, wherein each stage of the gate driving circuits includes an input part configured to generate a Q node signal in response to a carry signal of one of previous stages and a clock signal, the Q node signal being applied to Q node, an output part configured to output a gate output signal to a gate output terminal in response to the Q node signal, and a charge sharing part connected to the gate output terminal of a present stage and a gate output terminal of one of next stages, the charge sharing part configured to operate charge-sharing between the gate output signal of the present stage and a gate output signal of one of the next stages in response to a select signal.

20 Claims, 11 Drawing Sheets

(56) References Cited

U.S. PATENT DOCUMENTS

2012/0312967 A1 12/2012 De Wit et al.
2012/0320021 A1* 12/2012 Chang ............... G09G 3/3655
                                              345/211
2013/0010916 A1  1/2013 Jang et al.
2013/0051152 A1  2/2013 Lee et al.
2013/0088912 A1  4/2013 Son et al.

OTHER PUBLICATIONS

Maurice, F., et al., "High Resolution Projection Value with the Amorphous Silicon AMLCD Technology," SPIE, vol. 3296, pp. 92-99, Part of the IS&T/SPIE Conference on Projection Displays IV, San Jose, California, USA, Jan. 1998.

* cited by examiner

GATE DRIVER AND DISPLAY APPARATUS HAVING THE SAME

CROSS REFERENCE TO RELATED APPLICATION

This application claims priority from and the benefit of Korean Patent Application No. 10-2013-0093736, filed on Aug. 7, 2013, which is hereby incorporated by reference for all purposes as if fully set forth herein.

BACKGROUND

1. Field

Exemplary embodiments of the present invention relate to a gate driver and a display apparatus having the gate driver. More particularly, exemplary embodiments of the present invention relate to a gate driver with improved reliability and a display apparatus having the gate driver.

2. Discussion of the Background

Generally, a liquid crystal display ("LCD") apparatus includes a first substrate including a pixel electrode, a second substrate including a common electrode and a liquid crystal layer disposed between the first and second substrate. An electric field is generated by voltages applied to the pixel electrode and the common electrode. By adjusting an intensity of the electric field, a transmittance of a light passing through the liquid crystal layer may be adjusted so that a desired image may be displayed.

Generally, a display apparatus includes a display panel and a panel driver. The display panel includes a plurality of gate lines and a plurality of data lines. The panel driver includes a gate driver providing gate signals to the gate lines and a data driver providing data voltages to the data lines.

The gate driver includes multiples stages of gate driving circuits that include a plurality of switching elements. The switching element may be thin film transistors ("TFT"). In a conventional gate driver, high voltage is applied to a gate electrode of a pull up switching element at an output part by bootstrapping. Accordingly, following problems may occur: 1) changed threshold voltage of the pull up switching element; 2) increased power consumption due to a current leakage; and 3) false operation of the gate driving circuit due to decreased output voltage may occur.

The above information disclosed in this Background section is only for enhancement of understanding of the background of the invention and therefore it may contain information that does not form any part of the prior art nor what the prior art may suggest to a person of ordinary skill in the art.

SUMMARY

Exemplary embodiments of the present invention provide a gate driver with improved reliability and increased lifetime.

Exemplary embodiments of the present invention also provide a display apparatus having the gate driver.

Additional features of the invention will be set forth in the description which follows, and in part will be apparent from the description, or may be learned by practice of the invention.

An exemplary embodiment of the present invention discloses a gate driver, including multiple stages of gate driving circuits, wherein each stage of the gate driving circuits includes an input part configured to generate a Q node signal in response to a carry signal of one of previous stages and a clock signal, the Q node signal being applied to Q node, an output part configured to output a gate output signal to a gate output terminal in response to the Q node signal, and a charge sharing part connected to the gate output terminal of a present stage and a gate output terminal of one of next stages, the charge sharing part configured to operate charge-sharing between the gate output signal of the present stage and a gate output signal of one of the next stages in response to a select signal.

An exemplary embodiment of the present invention also discloses a display apparatus, including a display panel including a display region configured to display an image and a peripheral region adjacent to the display region, a data driver configured to apply a data voltage to the display panel, and a gate driver configured to apply a gate output signal to the display panel, the gate driver including multiple stages of gate driving circuits, wherein each stage of the gate driving circuits includes, an input part configured to generate a Q node signal in response to a carry signal of one of previous stages and a clock signal, the Q node signal being is applied to Q node, an output part configured to output a gate output signal to a gate output terminal in response to the Q node signal, and a charge sharing part connected to the gate output terminal of a present stage and a gate output terminal of one of next stages, the charge sharing part configured to operate charge-sharing between the gate output signal of the present stage and a gate output signal of one of the next stages in response to a select signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE INVENTION

Figure 1:
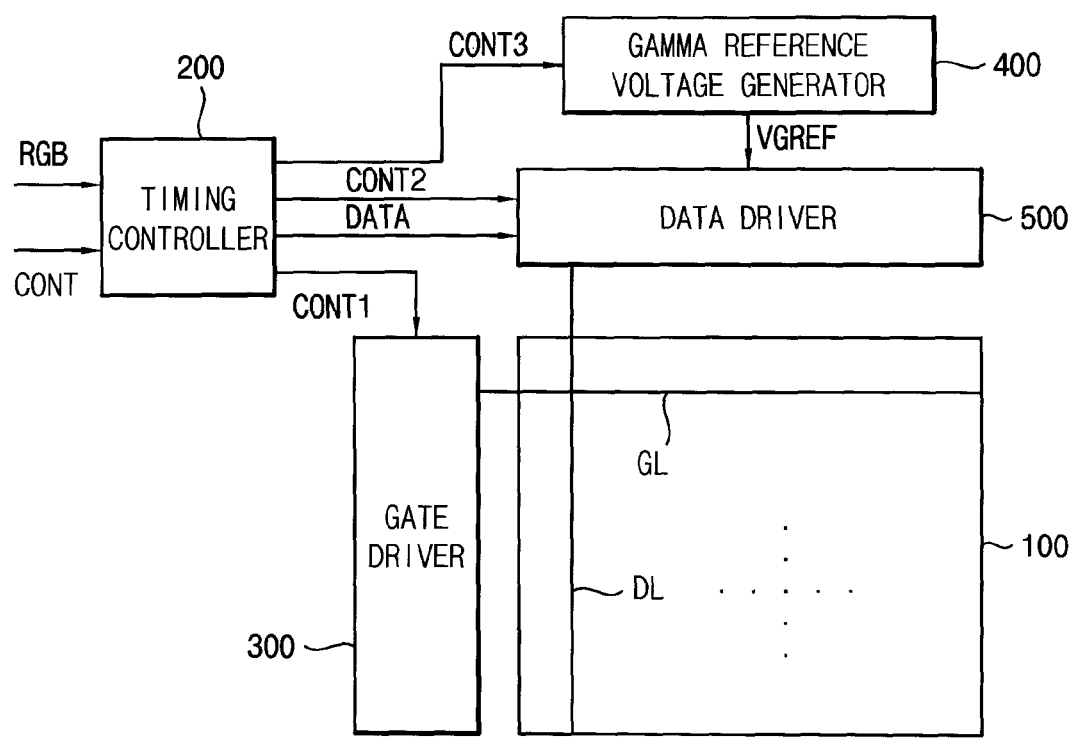
FIG. 1 is a block diagram illustrating a display apparatus according to an exemplary embodiment of the present invention.
Figure 1:
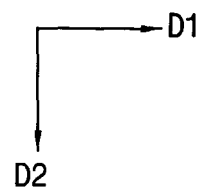

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a block diagram illustrating a display apparatus according to an exemplary embodiment of the present invention.

Referring to FIG. 1, the display apparatus includes a display panel 100 and a is panel driver. The panel driver includes a timing controller 200, a gate driver 300, a gamma reference voltage generator 400 and a data driver 500.

The display panel 100 has a display region on which an image is displayed and a peripheral region adjacent to the display region.

The display panel 100 includes a plurality of gate lines GL, a plurality of data lines DL and a plurality of unit pixels connected to the gate lines GL and the data lines DL. The gate lines GL extend in a first direction D1 and the data lines DL extend in a second direction D2 crossing the first direction D1.

Each unit pixel includes a switching element, a liquid crystal capacitor and a storage capacitor. The liquid crystal capacitor and the storage capacitor are electrically connected to the switching element. The unit pixels may be disposed in a matrix form.

The timing controller 200 receives input image data RGB and an input control signal CONT from an external apparatus (not shown). The input image data may include red image data R, green image data G and blue image data B. The input control signal CONT may include a master clock signal and a data enable signal. The input control signal CONT may include a vertical synchronizing signal and a horizontal synchronizing signal.

The timing controller 200 generates a first control signal CONT1, a second control signal CONT2, a third control signal CONT3 and a data signal DATA based on the input image data RGB and the input control signal CONT.

The timing controller 200 generates the first control signal CONT1 for controlling an operation of the gate driver 300 based on the input control signal CONT, and outputs the first control signal CONT1 to the gate driver 300. The first control signal CONT1 may further include a vertical start signal and a gate clock signal.

The timing controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The timing controller 200 generates the data signal DATA based on the input image data RGB. The timing controller 200 outputs the data signal DATA to the data driver 500.

The timing controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the timing controller 200. The gate driver 300 sequentially outputs the gate signals to the gate lines GL.

The gate driver 300 may be directly mounted on the display panel 100, or may be connected to the display panel 100 as a tape carrier package (TCP) type. Alternatively, the gate driver 300 may be integrated on the peripheral region of the display panel 100. A structure of the gate driver 300 is explained referring to FIG. 2 in detail.

The gamma reference voltage generator 400 generates a gamma reference voltage VGREF in response to the third control signal CONT3 received from the timing controller 200. The gamma reference voltage generator 400 provides the gamma reference voltage VGREF to the data driver 500. The value of the gamma reference voltage VGREF corresponds to a level of the data signal DATA.

In an exemplary embodiment, the gamma reference voltage generator 400 may be disposed in the timing controller 200, or in the data driver 500.

The data driver 500 receives the second control signal CONT2 and the data signal DATA from the timing controller 200, and receives the gamma reference voltages VGREF from the gamma reference voltage generator 400. The data driver 500 converts the data signal DATA into analog data voltages based on the gamma reference voltages VGREF. The data driver 500 outputs the data voltages to the data lines DL.

The data driver 500 may include a shift register, a latch, a signal processing part, and a buffer part. The shift register outputs a latch pulse to the latch. The latch temporally stores the data signal DATA. The latch outputs the data signal DATA to the signal processing part. The signal processing part generates a data voltage having an analog type based on the data signal having a digital type and the gamma reference voltage VGREF. The signal processing part outputs the data voltage to the buffer part. The buffer part compensates the data voltage to have a uniform level. The buffer part outputs the compensated data voltage to the data line DL.

The data driver 500 may be directly mounted on the display panel 100, or be connected to the display panel 100 in a TCP type. Alternatively, the data driver 500 may be integrated on the display panel 100.

Figure 2:
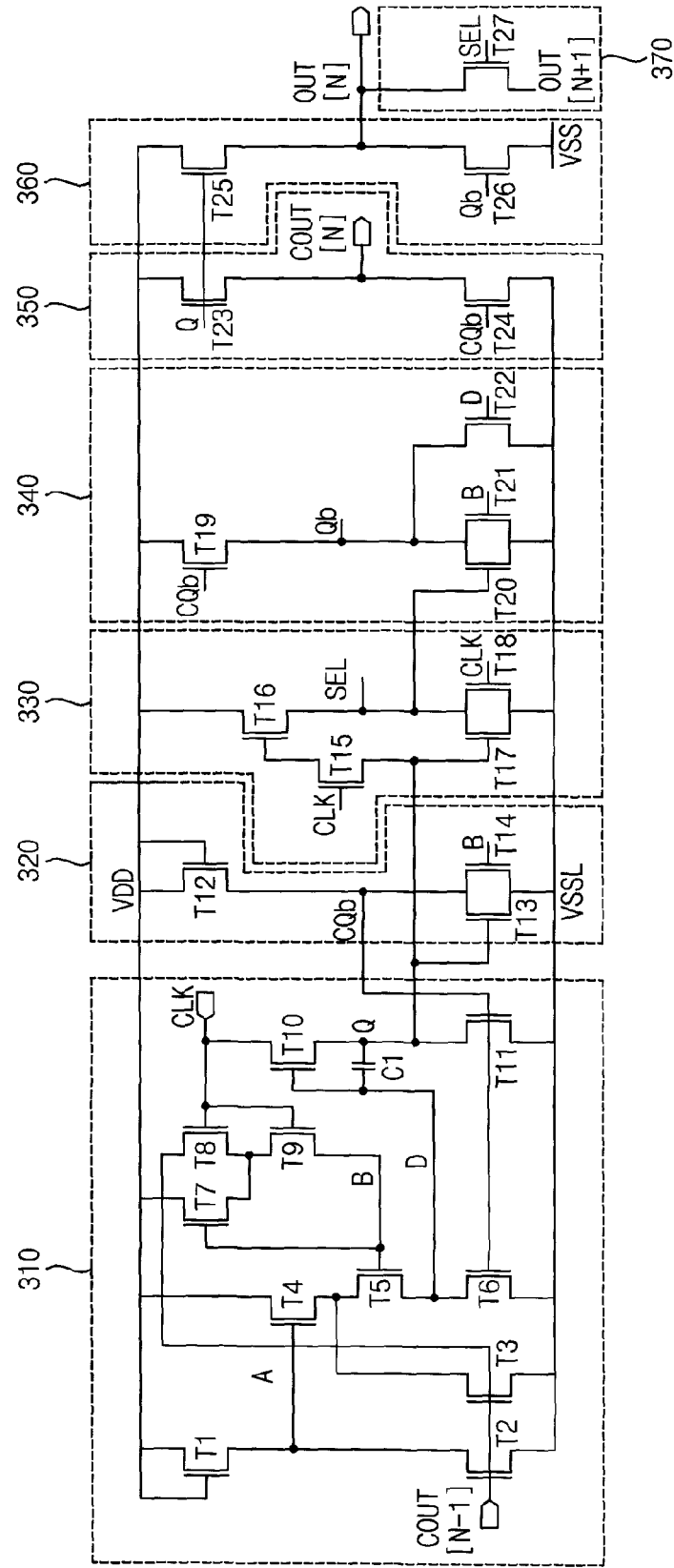
FIG. 2 is an equivalent circuit diagram illustrating an N-th stage of the gate driving circuits included in the gate driver of FIG. 1.
Figure 3:
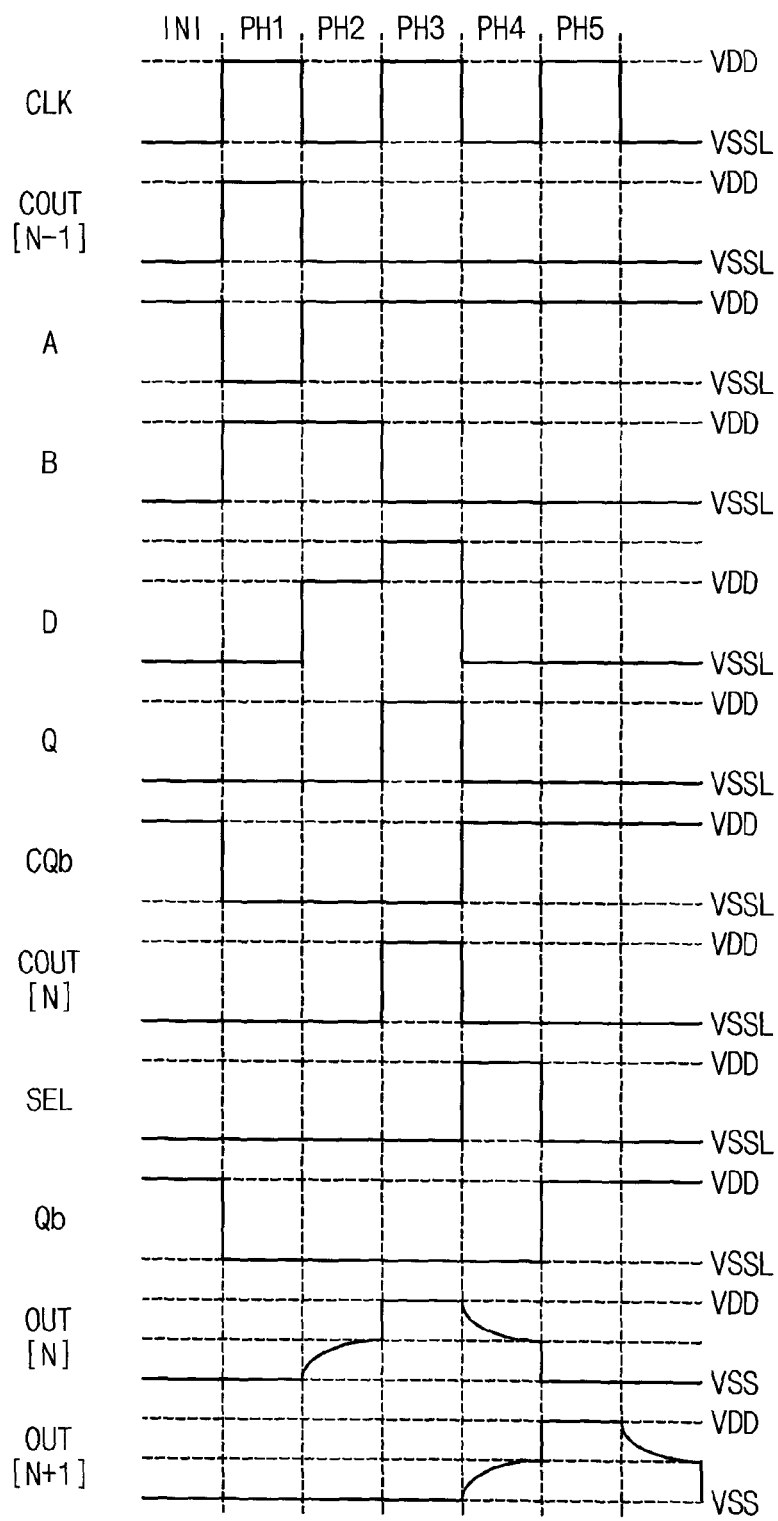
FIG. 3 is a waveform diagram illustrating input signals, node signals and output signals of the N-th stage of the gate driving circuits included in the gate driver of FIG. 2.

FIG. 2 is an equivalent circuit diagram illustrating an N-th stage of the gate driving circuits included in the gate driver 300 of FIG. 1. FIG. 3 is a waveform diagram illustrating input signals, node signals and output signals of the N-th stage of the gate driving circuits included in the gate driver 300 of FIG. 2.

Referring to FIGS. 1 to 3, the gate driver 300 receives a clock signal CLK, an ON voltage VDD, a first OFF voltage VSSL, and a second OFF voltage VSS. The gate driver 300 outputs a gate output signal OUT.

The clock signal CLK is applied to a clock terminal. The ON voltage is applied to an ON terminal. The first OFF voltage VSSL is applied to a first off terminal. The second OFF voltage VSS is applied to a second off terminal. The gate output signal OUT is outputted from a gate output terminal.

The clock signal CLK is a square wave periodically alternating between a high level and a low level. The high level of the clock signal CLK may correspond to the ON voltage VDD. The low level of the clock signal CLK may correspond to the first gate OFF voltage VSSL. The clock signal CLK may have a duty cycle of about 50%. Alternatively, the clock signal CLK may have a duty cycle less than 50%.

The ON voltage VDD may be a direct-current ("DC") voltage. The first OFF voltage VSSL may be a DC voltage. The second OFF voltage VSS may be a DC voltage. The first OFF voltage VSSL may be less than the second OFF voltage VSS. For example, the first OFF voltage VSSL may be about −10V, and the second OFF voltage VSS may be about −5V.

The N-th stage outputs an N-th gate output signal OUT[N] and an N-th carry signal COUT[N] in response to an (N−1)-th carry signal COUT[N−1] from an (N−1)-th stage, which is a previous stage of the N-th stage. Herein, N is a positive integer.

The first to last stages sequentially outputs gate output signals OUT in a same manner. The first stage may output a first gate output signal OUT[1] and a first carry signal COUT[1] in response to a vertical start signal, instead of the (N−1)-th carry signal COUT[N−1].

The (N−1)-th carry signal COUT[N−1] is applied to an (N−1)-th carry terminal. The N-th carry signal COUT[N] is outputted from an N-th carry terminal.

The n-th stage includes an input part 310, a carry holding part 320, a select signal generating part 330, an output holding part 340, a carry part 350, an output part 360 and a charge sharing part 370.

The input part 310 generates Q node signal in response to the (N−1)-th carry signal COUT[N−1] and the clock signal CLK, and applies the Q node signal to a Q node. The Q node signal turns on a pull-up transistor T25 of the output part 360 to pull up the gate output signal OUT[N]. The Q node signal turns on a first carry transistor T23 of the carry part 360 to pull up the carry signal COUT[N].

The input part 310 may further generate an A node signal, a B node signal, and a D node signal applied in response to the (N−1)-th carry signal COUT[N−1] and the clock signal CLK, and apply the A node signal, the B node signal, and the D node signal to an A node, a B node, and a D node, respectively.

The input part 310 includes first to eleventh input transistors T1 to T11 and a first capacitor C1.

The first input transistor T1 includes a control electrode configured to receive the ON voltage VDD, an input electrode configured to receive the ON voltage VDD, and an output electrode connected to the A node.

The second input transistor T2 includes a control electrode configured to receive the (N−1)-th carry signal COUT[N−1], an input electrode connected to the A node, and an output electrode configured to receive the first OFF voltage VSSL.

The third input transistor T3 includes a control electrode configured to receive the (N−1)-th carry signal COUT[N−1], an input electrode connected to the output electrode of the fourth input transistor T4, and an output electrode configured to receive the first OFF voltage VSSL.

The fourth input transistor T4 includes a control electrode connected to the A node, an input electrode configured to receive the ON voltage VDD, and an output electrode connected to the input electrode of the third input transistor T3.

The fifth input transistor T5 includes a control electrode connected to the B node, an input electrode connected to the input electrode of the third input transistor T3, and an output electrode connected to the D node.

The sixth input transistor T6 includes a control electrode connected to CQb node configured to receive CQb node signal, an input electrode connected to the D node, and an output electrode connected configured to receive the first OFF voltage VSSL.

The seventh input transistor T7 includes a control electrode connected to the B node, an input electrode configured to receive the ON voltage VDD, and an output electrode connected to an output electrode of the eighth input transistor T8.

The eighth input transistor T8 includes a control electrode configured to receive the clock signal CLK, an input electrode configured to receive the (N−1)-th carry signal COUT[N−1], and an output electrode connected to the output electrode of the seventh input transistor T7.

The ninth input transistor T9 includes a control electrode configured to receive the clock signal CLK, an input electrode connected to the output electrode of the seventh input transistor T7, and an output electrode connected to the B node.

The tenth input transistor T10 includes a control electrode connected to the D node, an input electrode configured to receive the clock signal CLK, and an output electrode connected to the Q node.

The eleventh input transistor T11 includes a control electrode connected to the CQb node, an input electrode connected to the Q node, and an output electrode configured to receive the first OFF voltage VSSL.

The first capacitor C1 includes a first electrode connected to the D node and a second electrode connected to the Q node.

The carry holding part 320 generates the CQb node signal in response to the Q node signal and the B node signal. The CQb node signal turns on a second carry transistor T24 of the carry part 350 to hold the carry signal COUT[N] at a low level.

The carry holding part 320 includes first to third carry holding transistor T12 to T14.

The first carry holding transistor T12 includes a control electrode configured to receive the ON voltage VDD, an input electrode configured to receive the ON voltage VDD, and an output electrode connected to input electrodes of the second and third carry holding transistors T13 and T14.

The second carry holding transistor T13 includes a control electrode connected to the Q node, an input electrode connected to the output electrode of the first carry holding transistor T12, and an output electrode configured to receive the first OFF voltage VSSL.

The third carry holding transistor T14 includes a control electrode connected to the B node, an input electrode connected to the output electrode of the first carry holding transistor T12, and an output electrode configured to receive the first OFF voltage VSSL.

The select signal generating part 330 generates a select signal SEL based on the clock signal CLK and the Q node signal. The select signal SEL controls an operation of a charge sharing transistor T27 of the charge sharing part 370.

When the select signal SEL has a high level, the charge sharing transistor T27 is turned on so that the gate output signal OUT[N] of the N-th stage and the gate output signal OUT[N+1] of the (N+1)-th stage are charge-shared. When the select signal SEL has a low level, the charge sharing transistor T27 is turned off so that the gate output signal OUT[N] of the N-th stage and the gate output signal OUT[N+1] of the (N+1)-th stage are not charge-shared.

The select signal generating part 330 includes first to fourth select signal generating transistors T15 to T18.

The first select signal generating transistor T15 includes a control electrode configured to receive the clock signal CLK, an input electrode connected to a control electrode of the second select signal generating transistor T16, and an output electrode connected to the Q node.

The second select signal generating transistor T16 includes a control electrode connected to the input electrode of the first select signal generating transistor T15, an input electrode configured to receive the ON voltage VDD, and an output electrode connected to input electrodes of the third and fourth select signal generating transistors T17 and T18.

The third select signal generating transistor T17 includes a control electrode connected to the Q node, an input electrode connected to the output electrode of the second select signal generating transistor T16, and an output electrode configured to receive the first OFF voltage VSSL.

The fourth select signal generating transistor T18 includes a control electrode configured to receive the clock signal CLK, an input electrode connected to the output electrode of the second select signal generating transistor T16, and an output electrode configured to receive the first OFF voltage VSSL.

The output holding part 340 generates Qb node signal applied to Qb node in response to the select signal SEL, the B node signal, the D node signal and the CQb node signal. The Qb node signal turns on a pull down transistor T26 of the output part 360 to hold the gate output signal OUT[N] at a low level.

The output holding part 340 includes first to fourth output holding transistors T19 to T22.

The first output holding transistor T19 includes a control electrode connected to the CQb node, an input electrode configured to receive the ON voltage VDD, and an output electrode connected to input electrodes of the second to fourth output holding transistors T20 to T22.

The second output holding transistor T20 includes a control electrode configured to receive the select signal SEL, an input electrode connected to the output electrode of the first output holding transistor T19, and an output electrode configured to receive the first OFF voltage VSSL.

The third output holding transistor T21 includes a control electrode connected to the B node, an input electrode connected to the output electrode of the first output holding transistor T19, and an output electrode configured to receive the first OFF voltage VSSL.

The fourth output holding transistor T22 includes a control electrode connected to the D node, an input electrode connected to the output electrode of the first output holding transistor T19, and an output electrode configured to receive the first OFF voltage VSSL.

The carry part 350 generates the carry signal COUT[N] in response to the Q node signal and the CQb node signal and outputs the carry signal COUT[N] through the carry terminal.

The carry part 350 includes the first carry transistor T23 and the second carry transistor T24. The first carry transistor T23 may be a carry pull up transistor. The second carry transistor T24 may be a carry pull down transistor.

The first carry transistor T23 includes a control electrode connected to the Q node, an input electrode configured to receive the ON voltage VDD, and an output electrode connected to the carry output terminal outputting the carry signal COUT[N].

The second carry transistor T24 includes a control electrode connected to the CQb node, an input electrode connected to the carry output terminal, and an output electrode configured to receive the first OFF voltage VSSL.

The output part 360 generates the gate output signal OUT[N] in response to the Q node signal and the Qb node signal and outputs the gate output signal OUT[N] through the gate output terminal.

The output part 360 includes a first output transistor T25 and a second output transistor T26. The first output transistor T25 may be a pull up transistor. The second output transistor T26 may be a pull down transistor.

The first output transistor T25 includes a control electrode connected to the Q node, an input electrode configured to receive the ON voltage VDD, and an output electrode connected to the gate output terminal.

The second output transistor T26 includes a control electrode connected to the Qb node, an input electrode connected to the gate output terminal, and an output electrode configured to receive the second OFF voltage VSS.

The output part 360 is pulled down using the second OFF voltage VSS greater than the first OFF voltage VSSL. Thus, when the Qb node signal has a low level, a voltage VGS between the gate electrode and the source electrode of the second output transistor T26 is less than zero so that the second output transistor T26 may be certainly turned off. Therefore the reliability of the gate driving circuit may be improved.

The charge sharing part 370 is connected to an N-th gate output terminal and an (N+1)-th gate output terminal. The charge sharing part 370 operates charge-sharing between the N-th gate output signal OUT[N] and the (N+1)-th gate output signal OUT[N+1] in response to the select signal SEL.

The charge sharing part 370 includes the charge sharing transistor T27. The charge sharing transistor T27 includes a control electrode configured to receive the select signal SEL, an input electrode connected to the N-th gate output terminal, and an output electrode connected to the (N+1)-th gate output terminal.

In the present exemplary embodiment, a signal (Q node signal) applied to the control electrode of the pull up transistor T25 is not bootstrapped to pull up the gate output signal OUT[N] to the high level. The gate output terminal is charge-shared with the adjacent output terminal to pull up the gate output signal OUT[N] to the high level. Thus, the signal (Q node signal) applied to the control electrode of the pull up transistor T25 may be prevented from increasing excessively from bootstrapping.

In the present exemplary embodiment, although the (N−1)-th carry signal is used as a previous carry signal, the previous carry signal is not limited to the (N−1)-th carry signal, and the previous carry signal may be a carry signal from any one of previous stages. Also, although the (N+1)-th carry signal is used as a next carry signal, the next carry signal is not limited to the (N+1)-th carry signal, and the next carry signal may be a carry signal of any one of next stages.

In the present exemplary embodiment, first to twenty seventh transistors may be oxide semiconductor transistors. A semiconductor layer of the oxide semiconductor transistor may include an oxide semiconductor material. For example, the semiconductor layer includes at least one of a zinc oxide, a tin oxide, a gallium indium zinc (Ga—In—Zn) oxide, indium zinc (In—Zn) oxide, indium tin (In—Sn) oxide, indium tin zinc (In—Sn—Zn) oxide. The semiconductor layer may include an oxide semiconductor doped with a metal such as aluminum (Al), nickel (Ni), copper (Cu), tantalum (Ta), molybdenum (Mo), hafnium (Hf), titanium (Ti), niobium (Nb), chromium (Cr), tungsten (W). The present invention is not limited to the above-mentioned materials of the oxide semiconductor. Alternatively, the first to twenty seventh transistors may be amorphous silicon transistors.

FIGS. 4A to 4F are equivalent circuit diagrams sequentially illustrating an exemplary operation of the N-th stage of the gate driving circuits included in the gate driver of FIG. 2.

Figure 4A:
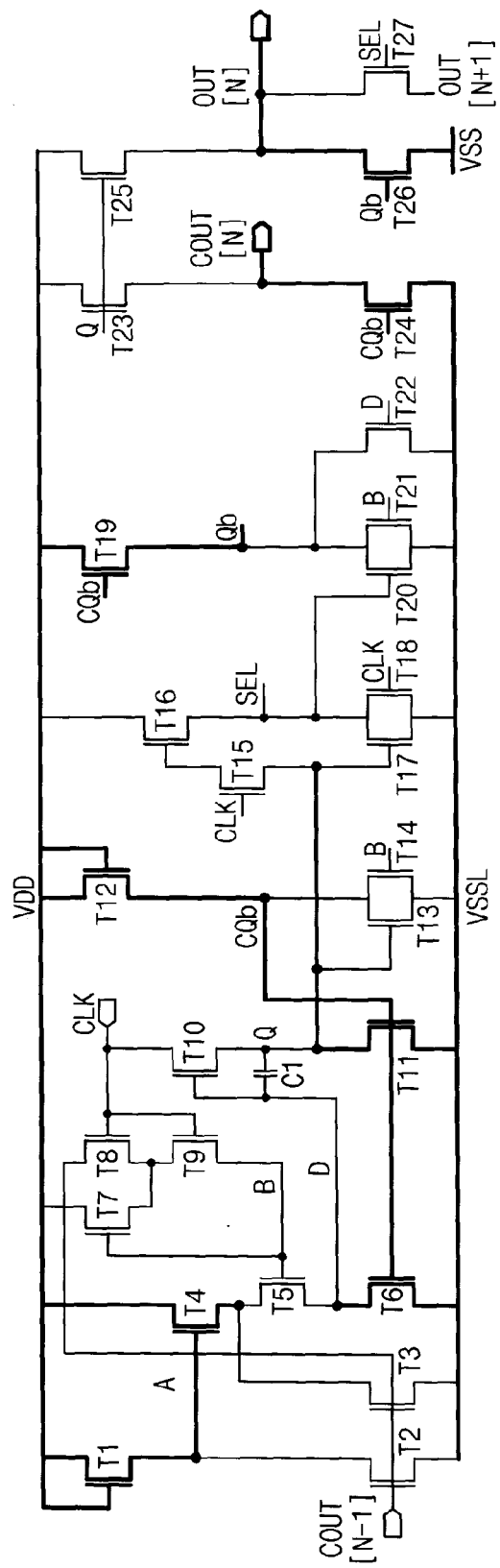
FIGS. 4A to 4F are equivalent circuit diagrams sequentially illustrating an exemplary operation of the N-th stage of the gate driving circuits included in the gate driver of FIG. 2.

FIG. 4A represents an initial phase IN1 of the operation of the gate driving circuit.

In the initial phase IN1, the first input transistor T1 is turned on and the A node signal has a high level.

The first carry holding transistor T12 is turned on and the CQb node signal has a high level. In response to the CQb node signal, the sixth input transistor T6, the eleventh input transistor T11, the first output holding transistor T19, and the second carry transistor T24 are turned on.

The D node signal, the Q node signal and the carry signal COUT[N] respectively have low levels, and the Qb node signal has a high level. The Qb node signal turns on the second output transistor T26 to pull down the gate output signal OUT[N].

Figure 4B:
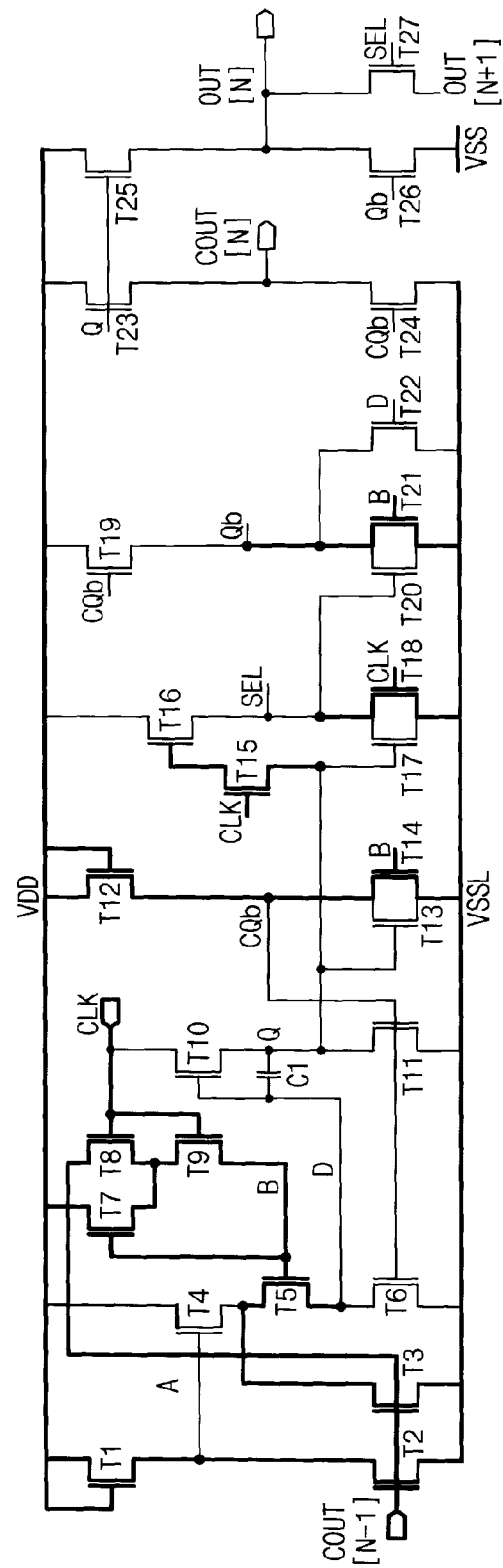

FIG. 4B represents a first phase PH1 of the operation of the gate driving circuit.

In the first phase PH1, the second and third input transistors T2 and T3 are turned on in response to the (N−1)-th carry signal COUT[N−1]. In the present exemplary embodiment, a channel width of the second input transistor T2 is greater than a channel width of the first input transistor T1. Thus, the A node signal has a low level. The D node signal maintains the low level by the fifth input transistor T5.

When the clock signal CLK becomes a high level, the fifth, seventh, eighth and ninth input transistors T5, T7, T8 and T9, the third carry holding transistor T14, the first select signal generating transistor T15, the fourth select signal generating transistor T18, and the third output holding transistor T21 are turned on. Accordingly, the CQb signal and the Qb signal become low levels. In the present exemplary embodiment, a channel width of the third carry holding transistor T14 is greater than a channel width of the first carry holding transistor T12. Thus, the CQb node signal has a low level.

Figure 4C:
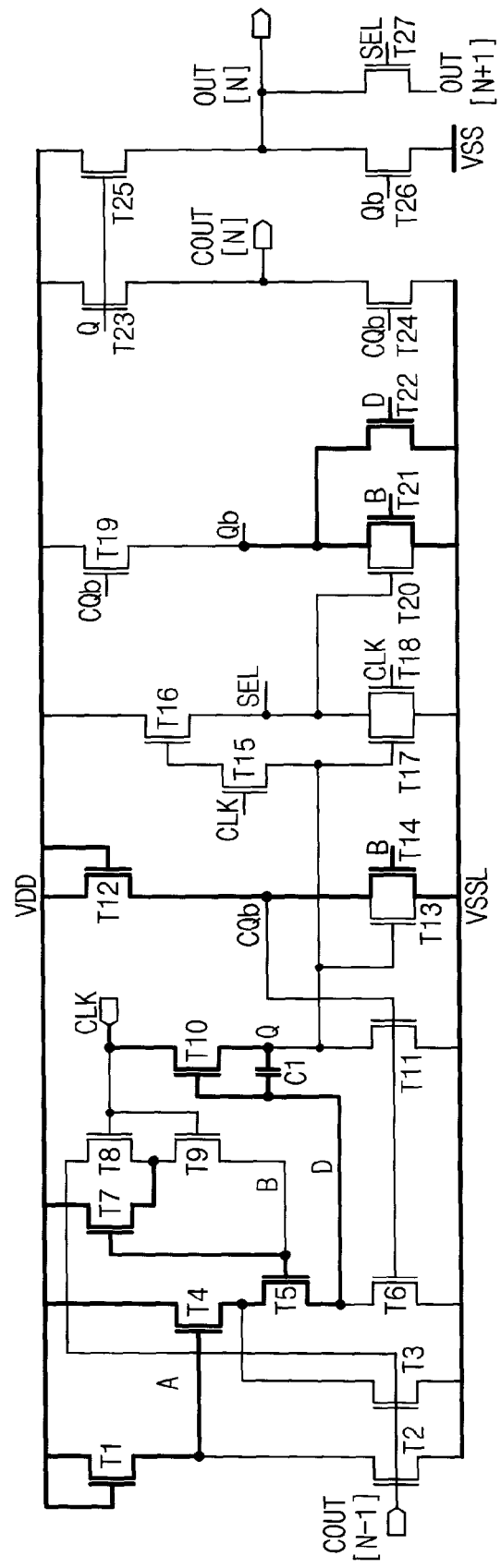

FIG. 4C represents a second phase PH2 of the operation of the gate driving circuit.

In the second phase PH2, when the clock signal CLK becomes a low level, the first input transistor T1 is turned on and the A node signal has a high level. The D node signal becomes a high level by the fifth input transistor T5.

The D node signal turns on the tenth input transistor T10 and the fourth output holding transistor T22, and maintains the low levels of the Q node signal and the Qb node signal. The seventh input transistor T7 is turned on in response to the B node signal. The B node signal maintains the high level by the ninth input transistor T9.

Figure 4D:
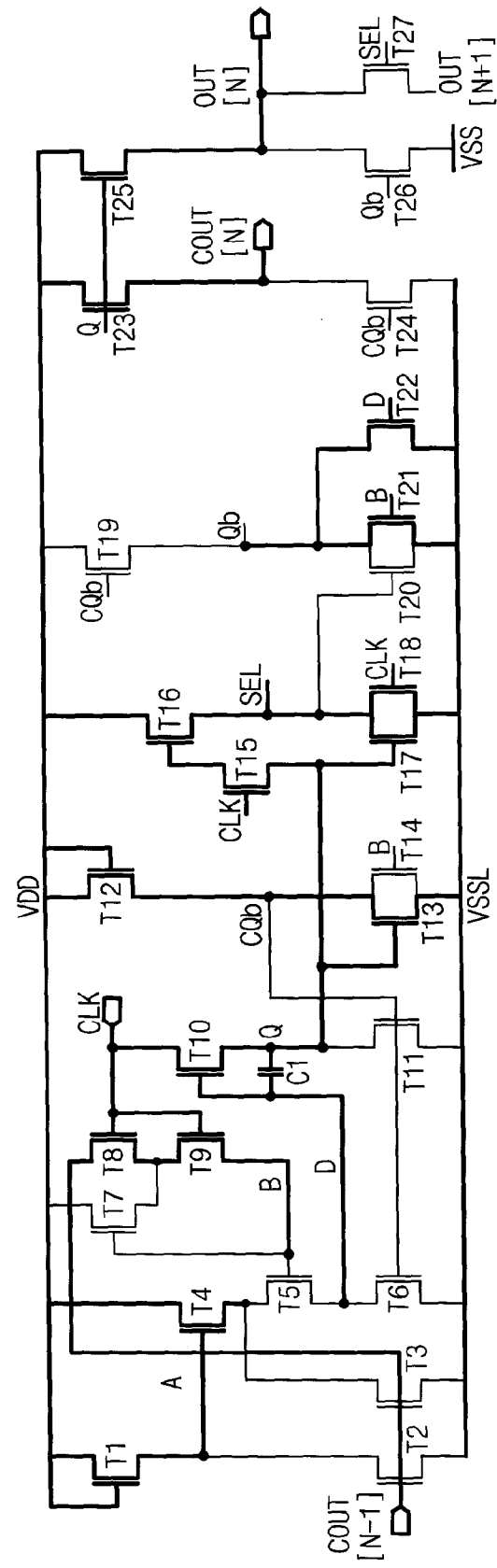

FIG. 4D represents a third phase PH3 of the operation of the gate driving circuit.

In the third phase PH3, when the clock signal CLK becomes a high level, the Q node signal becomes a high level and the D node having a floating status is bootstrapped.

The second carry holding transistor T13 and the first to fourth select signal generating transistors T15, T16, T17, and T18 are turned on, and the low levels of the CQb node signal, the Qb node signal, and the select signal SEL are maintained. In the present exemplary embodiment, channel widths of the third and fourth select signal generating transistor T17 and T18 are greater than a channel width of the second select signal generating transistor T16. Thus, the select signal SEL has a low level.

The first carry transistor T23 and the first output transistor T25 are turned on in response to the Q node signal and the carry signal COUT[N] and the gate output signal OUT[N] become high levels.

Figure 4E:
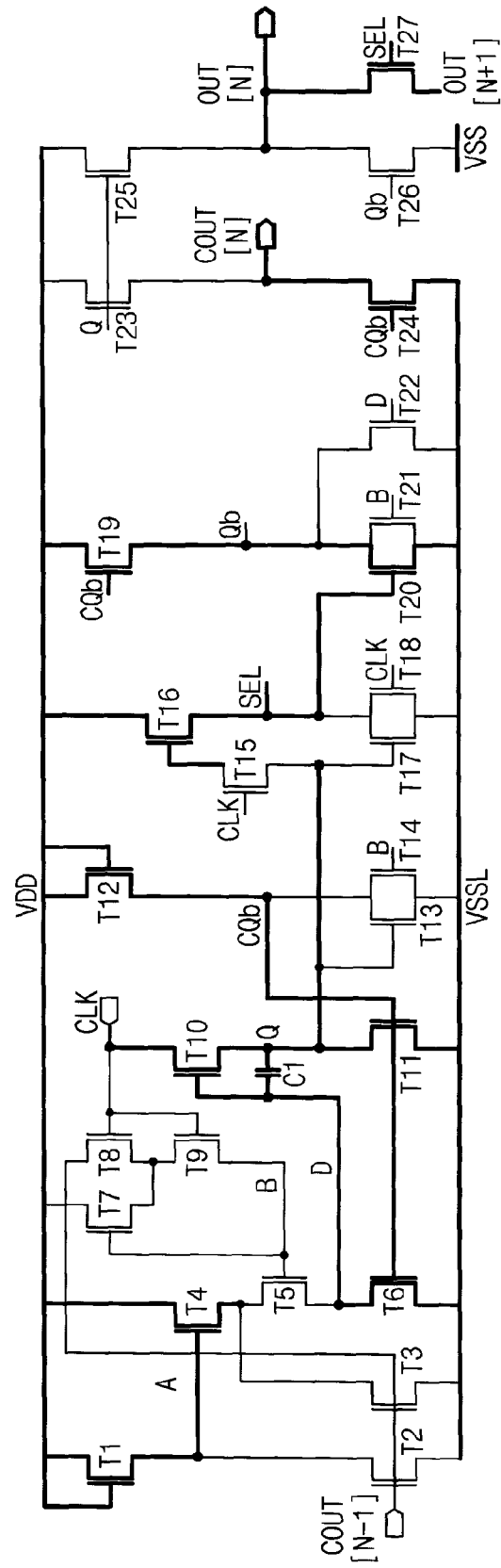

FIG. 4E represents a fourth phase PH4 of the operation of the gate driving circuit.

In the fourth phase PH4, the clock signal CLK becomes a low level, the Q node signal changed from the high level to the low level. Accordingly, the second carry holding transistor T13 and the third select signal generating transistor T17 are turned off and the CQb node signal has a high level.

The sixth and eleventh input transistors T6 and T11 are turned on in response to the CQb node signal and the D node signal has a low level.

The select signal SEL becomes a high level by the second signal generating transistor T16. The N-th gate output signal OUT[N] and the (N+1)-th gate output signal OUT[N+1] are charge-shared through the charge sharing transistor T27. In addition, the Qb node signal maintains the low level in response to the select signal SEL.

Figure 4F:
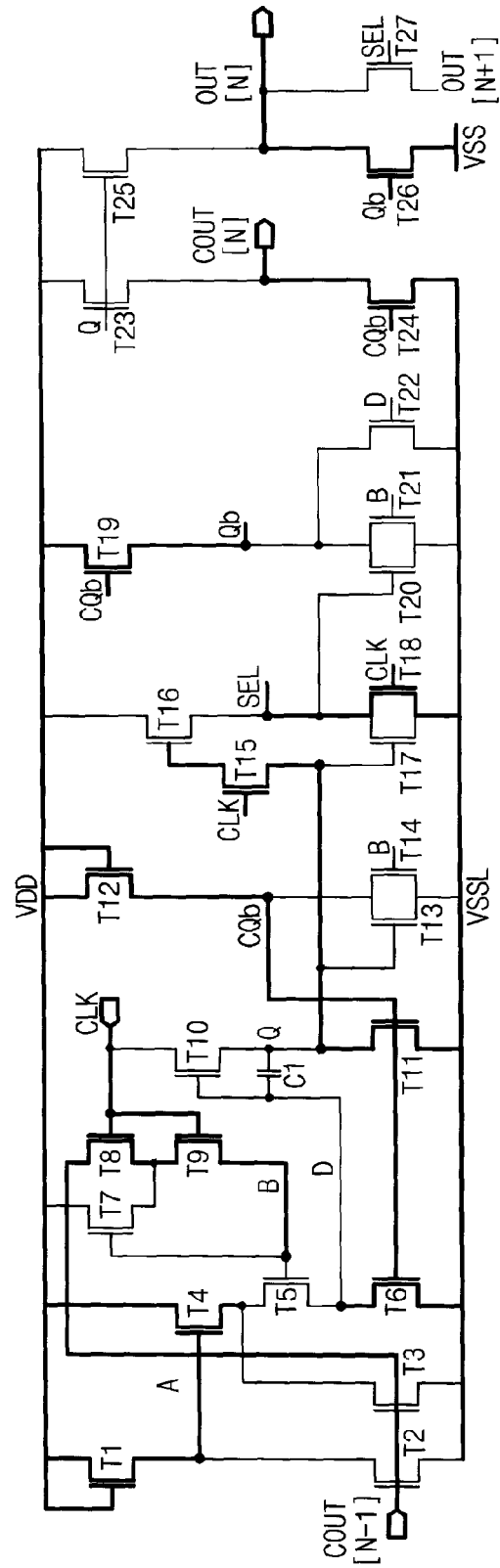

FIG. 4F represents a fifth phase PH5 of the operation of the gate driving circuit.

In the fifth phase PH5, the clock signal CLK becomes a high level and the eighth and ninth input transistors T8 and T9, and the first and fourth select signal generating transistors T15 and T18, are turned on. The select signal SEL has a low level by the fourth select signal generating transistor T18 and the charge sharing transistor T27 is turned off.

The CQb node signal turns on the first output holding transistor T19 and the Qb node signal becomes a high level. The Qb node signal turns on the second output transistor T26 to pull down the gate output signal OUT[N].

Figure 5:
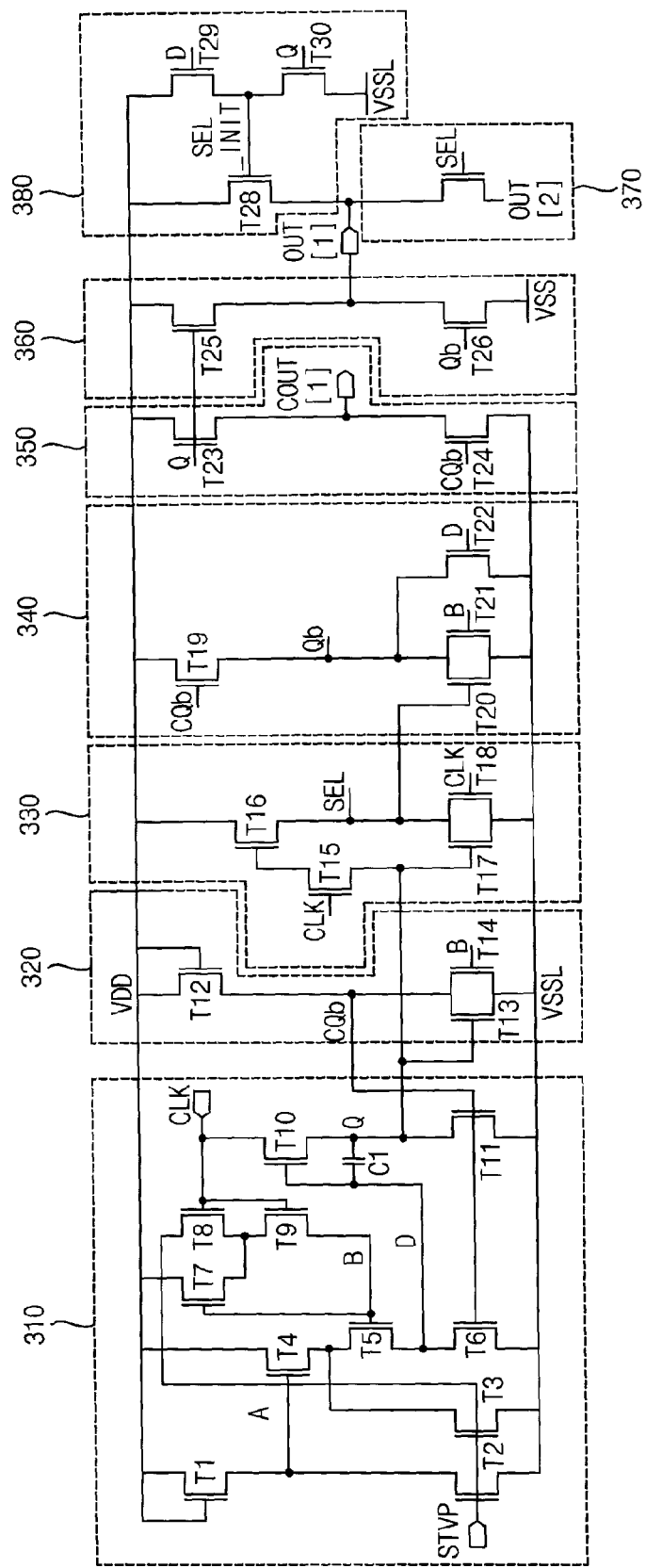
FIG. 5 is an equivalent circuit diagram illustrating a first stage of the gate driving circuits included in the gate driver of FIG. 1.
Figure 6:
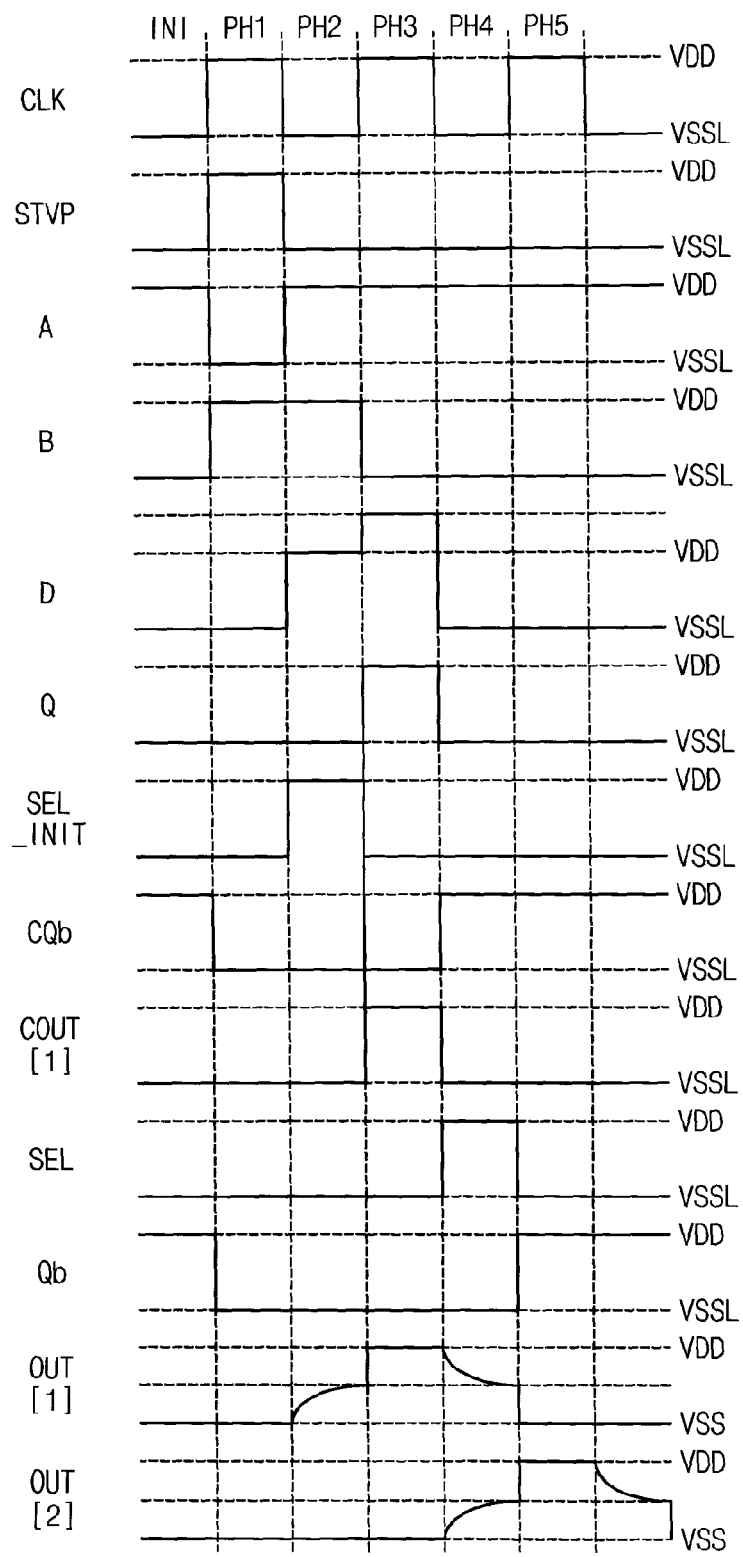
FIG. 6 is a waveform diagram illustrating input signals, node signals and output signals of the first stage of the gate driving circuits included in the gate driver of FIG. 5.

FIG. 5 is an equivalent circuit diagram illustrating a first stage of the gate driving circuits included in the gate driver of FIG. 1. FIG. 6 is a waveform diagram illustrating input signals, node signals and output signals of the first stage of the gate driving circuits included in the gate driver of FIG. 5.

The first stage of the gate driving circuits included in the gate driver is substantially the same as the N-th stage of the gate driving circuits explained referring to FIGS. 2 to 4F, except that the first stage further includes an initial select signal generating part. Thus, the same reference numerals will be used to refer to the same or like parts of FIGS. 2 to 4F and any repetitive explanation concerning the above elements will be omitted.

Referring to FIGS. 1 to 6, since the first stage does not have any previous stage providing a carry signal to drive the first stage, the first stage generates a first gate output signal OUT[1] and a first carry signal COUT[1] in response to a vertical start signal STVP.

The first stage includes an input part 310, a carry holding part 320, a select signal generating part 330, an output holding part 340, a carry part 350, an output part 360, a charge sharing part 370 and an initial select signal generating part 380.

Since the first stage does not have any previous stage, the gate output signal OUT[1] cannot be charge-shared with any gate output signal from the previous stage during the is second phase PH2. Thus, during the third phase PH3, the gate output signal OUT[1] may have a lower high level compared to the other stages, or increased time to reach a proper high level.

Therefore, the first stage may include the initial select signal generating part 380 to charge-share with the gate output signal OUT[1] during the second phase PH2.

The initial select signal generating part 380 generates an initial select signal SEL_INIT in response to the D node signal and the Q node signal. The initial select signal SEL_INIT may have a high level in the second phase PH2.

The initial select signal generating part 380 includes first to third initial select signal generating transistors T28 to T30.

The first initial select signal generating transistor T28 includes a control electrode connected to an output electrode of the second initial select signal generating transistor T29, an input electrode configured to receive the ON voltage VDD, and an output electrode connected to a first gate output terminal outputting the first gate output signal OUT[1].

The second initial select signal generating transistor T29 includes a control electrode connected to the D node, an input electrode configured to receive the ON voltage VDD, and an output electrode connected to the control electrode of the first initial select signal generating transistor T28.

The third initial select signal generating transistor T30 includes a control electrode connected to the Q node, an input electrode connected to the control electrode of the first initial select signal generating transistor T28, and an output electrode configured to receive the first OFF voltage VSSL.

According to the exemplary embodiments of the present invention, the gate driving circuit includes a charge sharing part operating charge-sharing between the gate output is signal of the present stage and the gate output signal of one of the next stages. Thus, the signal applied to the control electrode of the pull up transistor does not increase excessively by bootstrapping. Therefore, the gate driving circuit may have improved reliability and increased lifetime.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A gate driver, comprising multiple stages of gate driving circuits, wherein each stage of the gate driving circuits comprises:
    an input part configured to generate a Q node signal in response to a carry signal of one of previous stages and a clock signal, the Q node signal being applied to node;
    an output part configured to output a gate output signal to a gate output terminal in response to the Q node signal; and
    a charge sharing part connected to the gate output terminal of a present stage and a gate output terminal of one of next stages, the charge sharing part configured to operate charge-sharing between the gate output signal of the present stage and a gate output signal of one of the next stages in response to a select signal.

2. The gate driver of claim 1, wherein each charge sharing part comprises a charge sharing transistor, wherein the charge sharing transistor comprises a control electrode configured to receive the select signal, an input electrode connected to the gate output terminal of the present stage, and an output electrode connected to the gate output terminal of one of the next stages.

3. The gate driver of claim 1, wherein each stage of the gate driving circuits further comprises a select signal generating part configured to generate the select signal based on the clock signal and the Q node signal.

4. The gate driver of claim 3, wherein each select signal generating part comprises first to fourth select signal generating transistors, wherein
    the first select signal generating transistor comprises a control electrode configured to receive the clock signal, an input electrode connected to a control electrode of the second select signal generating transistor, and an output electrode connected to the Q node,
    the second select signal generating transistor co ses the control electrode connected to the input electrode of the first select signal generating transistor, an input electrode configured to receive an ON voltage, and an output electrode connected to input electrodes of the third and fourth select signal generating transistors,
    the third select signal generating transistor comprises a control electrode connected to the Q node, the input electrode connected to the output electrode of the second select signal generating transistor, and an output electrode configured to receive a first OFF voltage, and
    the fourth select signal generating transistor comprises a control electrode configured to receive the clock signal, the input electrode connected to the output electrode of the second select signal generating transistor, and an output electrode configured to receive the first OFF voltage.

5. The gate driver of claim 1, wherein each input part comprises first o eleventh transistors and a first capacitor, wherein
    the first input transistor comprises a control electrode configured to receive an ON voltage,
    the second and third input transistors comprise control electrodes configured to receive the carry signal of one of the previous stages,
    the fourth input transistor comprises a control electrode connected to an output electrode of the first input transistor,
    the fifth and seventh input transistors comprise control electrodes connected to a B node configured to receive a B node signal,
    the sixth and eleventh input transistors comprise control electrodes connected to a CQb node configured to receive a CQb node signal,
    the eighth and ninth input transistors comprise control electrodes configured to receive the clock signal;
    the tenth input transistor comprises a control electrode connected to D node configured to receive a D node signal; and
    the first capacitor comprises a first terminal connected to the D node and a second terminal connected to the Q node.

6. The gate driver of claim 1, wherein each output part comprises a first output transistor and a second output transistor, wherein the first output transistor comprises a control electrode connected to the Q node, an input electrode configured to receive an ON voltage, and an output electrode connected to the gate output terminal of the present stage; and the second output transistor comprises a control electrode connected to a Qb node configured to receive a Qb node signal, an input electrode connected to the gate output terminal of the present stage, and an output electrode configured to receive a second OFF voltage.

7. The gate driver of claim 6, wherein each stage of the gate driving circuits further comprises an output holding part configured to generate the Qb node signal in response to the select signal, a B node signal, a D node signal, and a CQb node signal.

8. The gate driver of claim 7, wherein each output holding part comprises first to fourth output holding transistors, wherein the first output holding transistor comprises a control electrode connected to a CQb node configured to receive the CQb node signal, an input electrode configured to receive the ON voltage, and an output electrode connected to input electrodes of the second to fourth output holding transistors;

the second output holding transistor comprises a control electrode configured to receive the select signal, the input electrode connected to the output electrode of the first output holding transistor, and an output electrode configured to receive a first OFF voltage;

the third output holding transistor comprises a control electrode connected to a B node configured to receive the B node signal, the input electrode connected to the output electrode of the first output holding transistor, and an output electrode configured to receive the first OFF voltage; and the fourth output holding transistor comprises a control electrode connected to a D node configured to receive the D node signal, the input electrode connected to the output electrode of the first output holding transistor, and an output electrode configured to receive the first OFF voltage.

9. The gate driver of claim 1, wherein each stage of the gate driving circuits further comprises a carry part configured to generate a carry signal in response to the Q node signal and a CQb node signal.

10. The gate driver of claim 9, wherein each carry part comprises a first carry transistor and a second carry transistor, wherein the first carry transistor comprises a control electrode connected to the node, an input electrode configured to receive an ON voltage, and an output electrode connected to a carry output terminal outputting the carry signal, and the second carry transistor comprises a control electrode connected to a CQb node configured to receive the CQb node signal, an input electrode connected to the carry output terminal, and an output electrode configured to receive a first OFF voltage.

11. The gate driver of claim 10, wherein each stage of the gate driving circuits further comprises a carry holding part configured to generate the CQb node signal in response to the Q node signal and a B node signal.

12. The gate driver of claim 11, wherein each carry holding part comprises first to third carry holding transistors, wherein the first carry holding transistor comprises a control electrode and an input electrode configured to receive the ON voltage, and an output electrode connected to input electrodes of the second and third carry holding transistors, the second carry holding transistor comprises a control electrode connected to the Q node, the input electrode connected to the output electrode of the first carry holding transistor, and an output electrode configured to receive the first OFF voltage, and the third carry holding transistor comprises a control electrode connected to a B node configured to receive the B node signal, the input electrode connected to the output electrode of the first carry holding transistor, and an output electrode configured to receive the first OFF voltage.

13. The gate driver of claim 1, wherein a first stage of the gate driving circuit further comprises an initial select signal generating part configured to generate an initial select signal in response to a D node signal and the Q node signal.

14. The gate driver of claim 13, wherein the initial select signal generating part comprises first to third initial select signal generating transistors, wherein the first initial select signal generating transistor comprises a control electrode connected to an output electrode of the second initial select signal generating transistor, an input electrode configured to receive an ON voltage, and an output electrode connected to the gate output terminal of the first stage, the second initial select signal generating transistor comprises a control electrode connected to a D node configured to receive the D node signal, an input electrode configured to receive the ON voltage, and the output electrode connected to the control electrode of the first initial select signal generating transistor; and the third initial select signal generating transistor comprises a control electrode connected to the Q node, an input electrode connected to the control electrode of the first initial select signal generating transistor, and an output electrode configured to receive a first OFF voltage.

15. The gate driver of claim 1, wherein the gate driving circuit comprises a plurality of oxide semiconductor transistors.

16. A display apparatus, comprising:

a display panel comprising a display region configured to display an image and a peripheral region adjacent to the display region;

a data driver configured to apply a data voltage to the display panel; and a gate driver configured to apply a gate output signal to the display panel, the gate driver comprising multiple stages of gate driving circuits, wherein each stage of the gate driving circuits comprises:

an input part configured to generate a Q node signal in response to a carry signal of one of previous stages and a clock signal, the node signal being applied to Q node;

an output part configured to output agate output signal to a gate output terminal in response to the Q node signal; and a charge sharing part connected to the gate output terminal of a present stage and a gate output terminal of one of next stages, the charge sharing part configured to operate charge-sharing between the gate output signal of the present stage and a gate output signal of one of the next stages in response to a select signal.

17. The display apparatus of claim 16, wherein each charge sharing part comprises a charge sharing transistor, the charge sharing transistor comprising a control electrode configured to receive the select signal, an input electrode connected to the gate output terminal of the present stage, and an output electrode connected to the gate output terminal of one of the next stages.

18. The display apparatus of claim 16, wherein each stage of the gate driving circuits further comprises a select signal generating part configured to generate the select signal based on the clock signal and the Q node signal.

19. The display apparatus of claim 16, wherein the gate driving circ it comprises a plurality of oxide semiconductor transistors.

20. The display apparatus of claim 16, wherein the gate driver is integrated on the peripheral region of the display panel.

* * * * *